United States Patent [19]

Chew et al.

[11] Patent Number: 5,522,937

[45] Date of Patent: Jun. 4, 1996

[54] WELDED SUSCEPTOR ASSEMBLY

[75] Inventors: Sandy M. Chew, San Jose; Dale R. DuBois; Ronald L. Rose, both of Los Gatos; Manus Wong, San Jose, all of Calif.

[73] Assignee: Applied Materials, Inc., Santa Clara, Calif.

[21] Appl. No.: 237,084

[22] Filed: May 3, 1994

[51] Int. Cl.⁶ .................................................. C23C 16/00
[52] U.S. Cl. ...................... 118/728; 118/500; 118/723 E
[58] Field of Search .................................... 118/728, 500, 118/723 C; 174/68.1, 68.3

[56] References Cited

U.S. PATENT DOCUMENTS

| | | | |
|---|---|---|---|
| 3,622,943 | 11/1971 | Reimer | 339/103 |
| 3,642,457 | 2/1972 | Brill-Edwards | 29/196.5 |
| 4,028,064 | 6/1977 | Cassidy | 428/675 |
| 4,103,725 | 8/1978 | Abe | 151/35 |
| 4,178,877 | 12/1979 | Kudo | 118/728 |
| 4,302,136 | 11/1981 | Abe | 411/158 |
| 5,019,233 | 5/1991 | Blake | 204/792.12 |
| 5,235,136 | 8/1993 | Santucci | 174/68.3 |
| 5,359,143 | 10/1994 | Simon | 174/101 |

*Primary Examiner*—R. Bruce Breneman
*Assistant Examiner*—Jeffrie R. Lund
*Attorney, Agent, or Firm*—Janis Biksa

[57] ABSTRACT

A susceptor support arm assembly in a substrate processing chamber includes a secure ground connection between the susceptor and ground. An aluminum wire rope is welded to a winged terminal lug which is tightly inserted into a hole in a susceptor hub. The wings of the lug are then welded to the hub. The wire rope, now permanently attached to the susceptor hub, is routed through an opening in the susceptor end of a ceramic susceptor support arm, able to pass the ground end lug of the wire rope, through a channel in the support arm back to the susceptor arm support device, and to ground. The channel in the susceptor arm has grooves in its sides to receive a paddle shaped ceramic cover to enclose the channel and the bottom of the hub end of the susceptor arm. The cover insulates, isolates, and shields the grounding wire and thermocouple leads being routed from the susceptor hub back to the support end of the susceptor arm from exposure to the high intensity radiant energy directed at the back of the susceptor. Conical spring washers and shoulder screws, attach the metallic pieces (e.g. the susceptor hub) to the ceramic susceptor hub arm allowing for the differential thermal expansion between pieces without overstressing the ceramic material clamped. Surface treatment of the metallic pieces enhances their corrosion resistance.

40 Claims, 10 Drawing Sheets

WELDED SUSCEPTOR ASSEMBLY

FIELD OF THE INVENTION

This invention relates to the field of susceptor assemblies as generally used to process semiconductor substrates.

BACKGROUND OF THE INVENTION

A susceptor plate for processing semiconductor substrates (wafers) using plasma enhanced chemical vapor deposition (PECVD) and other similar processes must be in firm contact with an electrical ground to prevent warpage of the susceptor plate. When the susceptor plate ground connection is interrupted, the build-up of plasma energy causes differential thermal heating and warpage of the susceptor plate. When the susceptor warps, its edges generally rise so that the plate forms a bowl shape. The position of a substrate supported on such a warped susceptor no longer meets process criteria, and can cause wafers processed on such a susceptor to be rejected.

Repeated heating and cooling of clamped ground connections during normal substrate processing cycles makes it very difficult to maintain a firm ground connection because repeated expansion and contraction or breakage tends to loosen clamped pieces. The gases used in processing semiconductor wafers are often corrosive and work their way into all nooks and crannies, especially spaces between fasteners and the items being fastened, e.g. the ground connection.

The presence of corrosive gas and the repeated thermal cycling, differential thermal expansion, and relaxation creep of metals at elevated temperatures experienced during processing tends to degrade the electrical ground path, usually passing through an aluminum tube clamped to the back of the susceptor. Such conditions over time reduce and relax the clamping force until the electrical ground connection is no longer viable. This problem is exacerbated by the fine detail and precise assembly which is required of existing susceptor assemblies. In this day and age, the increasing demands for accuracy in semiconductor processing require that susceptor warpage be avoided so that coating and etching of semiconductor wafers be done as precisely and repeatably as possible without the susceptor warpage that occurs when the ground connection is not secure.

Figure 1:
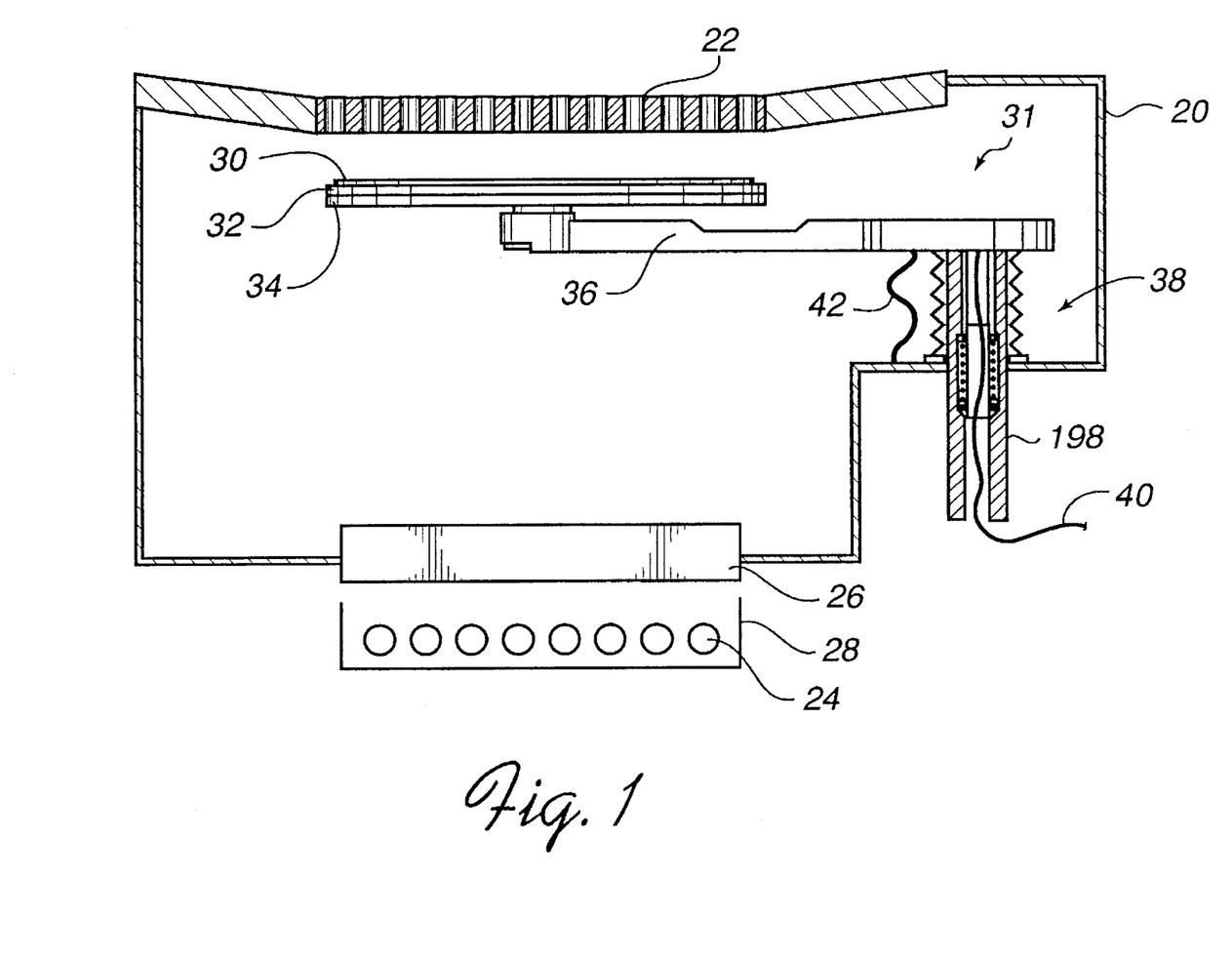
FIG. 1 shows a cross-section of a processing chamber showing a susceptor assembly in context.
Figures 2, 3:
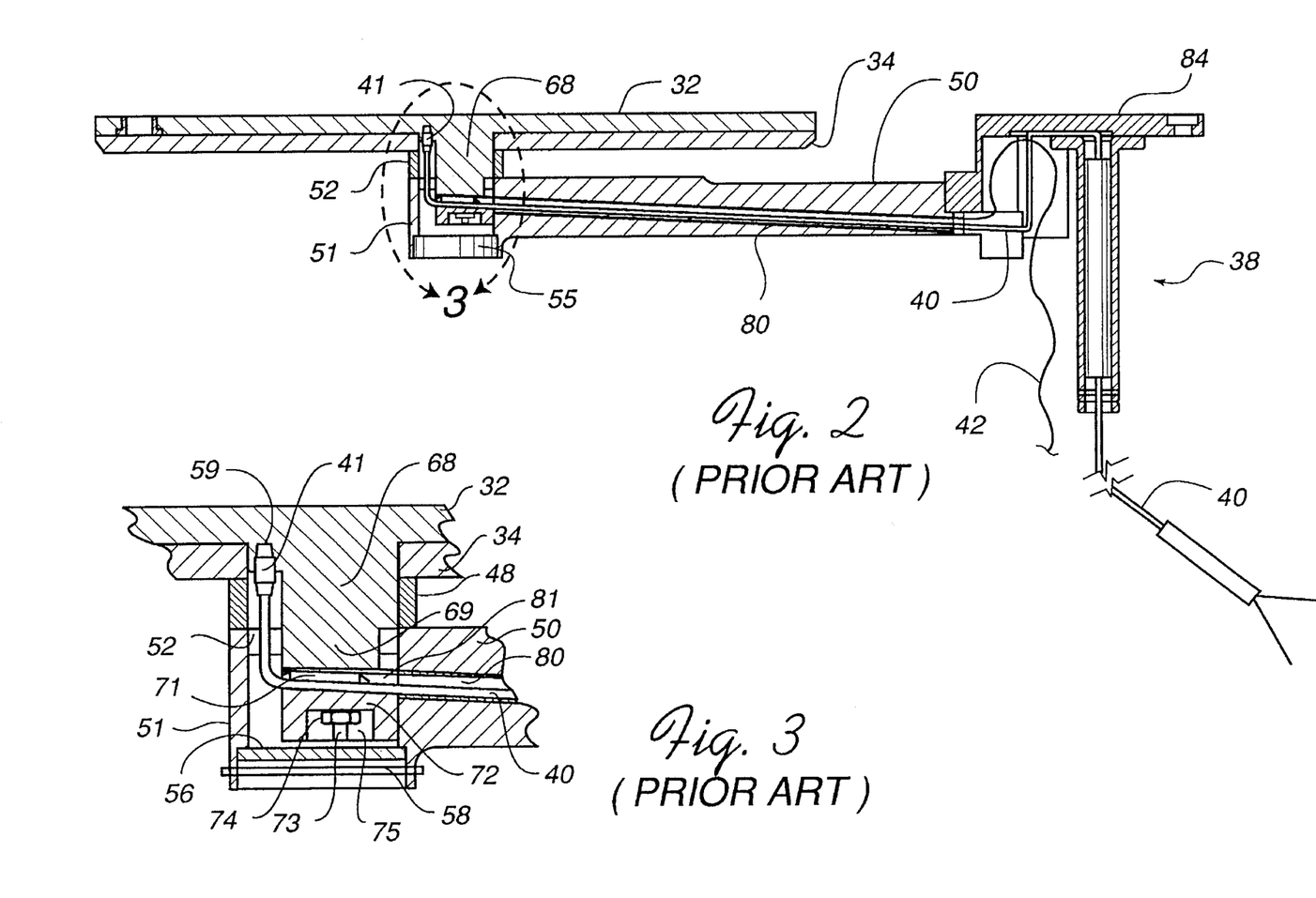
FIG. 2 shows a cross section of a prior art susceptor assembly.
FIG. 3 shows a close up of the hub end of the susceptor assembly of FIG. 2.
Figure 4:
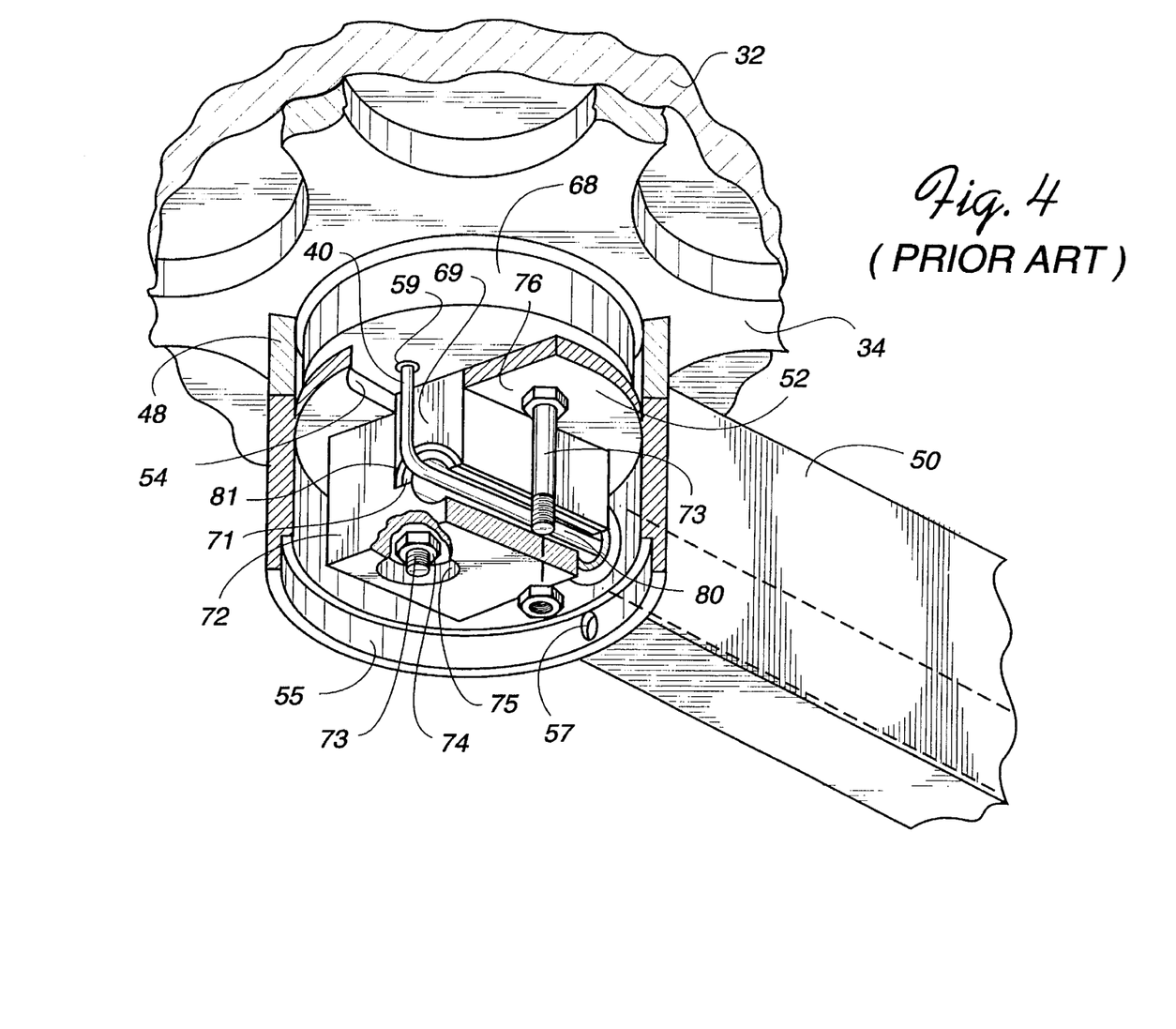
FIG. 4 shows a cut away perspective view of the hub end of the susceptor of FIG. 2.

An illustration of an existing susceptor assembly in a typical processing chamber will highlight the problem. The general configuration of a vapor deposition processing chamber is shown in FIG. 1 (a susceptor assembly configuration according to the invention is pictured). A processing chamber 20 contains a susceptor assembly 31 supporting a wafer 30. Process gas flows through holes in an electrically biased gas distribution plate 22 towards the face of the wafer (substrate) 30 supported by the susceptor assembly 31. The gas distribution plate 22 is often energized by the use of RF power which causes the processed gas to form a plasma. The susceptor disk 32 in the prior art (as shown in FIGS. 2, 3 and 4) is grounded through an aluminum tube extending through a hollow passage in a ceramic susceptor arm 36. The aluminum tube is then grounded (usually by a ground strap 42) to the usually cool process chamber wall.

During processing, the susceptor disk 32 is heated from its backside (the bottom 28 as shown in FIG. 1) by radiant heat from heating lamps 24 shining through a sealed quartz window 26 and a ceramic backing plate 34. The susceptor temperature reaches to approximately 475 to 500 degrees Celsius.

An example, of such a prior an susceptor assembly is shown in FIGS. 2, 3, and 4. The susceptor assembly includes a aluminum susceptor plate 32 having a susceptor hub 68. The plate 32 is backed by a ceramic plate 34 having Swiss cheese type holes (e.g. see FIG. 5) to selectively control the susceptor plate's exposure to radiant heat from the heat lamps 24. A susceptor hub 68 integral with the susceptor plate 32 includes an alignment/grounding blade 69, a thermocouple receiving hole 59, and several holes for receiving fastening studs 73.

The hub 68 is supported by a ceramic susceptor arm 50. The arm 50 includes a tubular passage to protect and guide an aluminum grounding tube 80. The tube 80 extends through the passage but only a partial tube wall extension 81 extends into the hub end 51 and into contact with the bottom of the end of the susceptor hub blade 69. A thermocouple lead 40 is routed through the tube 80 and terminates with the thermocouple end 41 in the thermocouple receiving hole 59.

The susceptor hub blade 69 is aligned to a blade receiving slot 54 and secured to a web 52 in hub end 51 of the arm 50 by integral intermediate flange nuts 76 (only one is shown in FIG. 4) on the studs 73 which are carefully tightened to a predetermined torque. The end of the hub blade is shaped to match the outside of the tube extension 81. To prevent collapsing the tube extension 81 and pinching the thermocouple lead 40, a hollow half cylinder shaped mandrel 71 is located inside the tube extension 81. A clamping block 72 slips over the stud 73 ends and clamps the tube extension 81 between the mandrel 71 and the end of the of the hub blade 69 as stud nuts 74 are tighten to a specified torque in counterbore openings 75 in the bottom of the block 72. There are counterbores in the top of the block 72 which provide clearance for the middle nut flanges 76 of the studs 73, so the block 72 is secured against the flat bottom of the web 52. FIG. 4 shows the block 72 cut away to show: the extension tube 81 clamping arrangement, the middle nut flange 76 of the right stud 73 (also cut away), and the left stud end and nut 74 in the counterbore 75.

The hub end 51 includes a bottom opening recess 55 to receive a ceramic disk shaped circular cover 56 (FIG. 3) to shield the contents of the hub from direct exposure to radiant heating. The cover 56 is retained in the recess 55 by a ceramic pin 58 placed in two pin receiving holes 57 (FIG. 4) aligned across the recess opening 55.

A ceramic collar 48 surrounds the susceptor hub 68 at the top to assist in protecting the thermocouple and hub from the processing chamber environment. This pin sometimes falls out exposing the hub pieces to extreme temperatures resulting from direct exposure to radiant heating.

An aluminum susceptor arm end support 84 is clamped to the support end of the arm 50 to support it from the lift mechanism 38 (FIG. 2). A ground rope 42 is welded to the support end of the aluminum tube 80 and is routed into contact with the end support 84 on its way to a ground connection on the wall of the processing chamber 20.

The thermocouple lead 40 is routed from a threaded thermocouple receiving hole 59 in the back of the susceptor plate 32 between the mandrel 71 and the clamping block 72, through the tube 80, and through a vacuum seal in the central core of the susceptor lift mechanism 38.

To work properly, the above pieces must be carefully assembled. The assembly or disassembly of a large number of pieces according to a detailed assembly procedure unnecessarily complicates the configuration and increases the chance that an initially created ground connection will not be reliable after many processing cycles. When the susceptor is not grounded, the susceptor temperature builds up unevenly and warpage begins to occur.

When potentially thousands of wafers are processed through one processing chamber having a single susceptor assembly, even small variations in the process conditions resulting from susceptor warpage can create an operating problem. Additional monitoring (quality assurance-inspection) is needed to assure that susceptor warpage does not affect wafers being processed.

SUMMARY OF THE INVENTION

This invention provides for making a continuous uninterrupted RF ground connection by using a ground wire welded to the susceptor. The ground wire connects the susceptor to the process chamber ground (wall). The ground connection is shielded from the temperature extremes by being routed in a channel of the susceptor arm, the channel having a removable cover. The susceptor arm supporting the susceptor is a one piece ceramic material (alumina) having a low coefficient of expansion and good insulating qualities.

A configuration according the invention provides that an aluminum wire rope is welded to lugs (or terminals) at either of its ends. The lug at one end includes one or more side flanges or wings extending laterally from the rope. The end of the lug extends beyond the flange. The end of the lug extending beyond the flange is configured to fit tightly in a lug receiving hole in a hub on the back of the susceptor. The side flanges are welded to a back surface of the susceptor hub. The weld is located where distortion, if any, of the hub in the localized area of the weldments does not warp the dimensions of pieces supporting a wafer. The lug at the other end of the grounding rope has a cross section which is configured to pass through an opening in the susceptor arm supporting the susceptor hub. The wire rope can then be laid in the open channel of the arm and then covered as it is being routed to the ground. To assure a ground connection, a technician needs only to make one connection, i.e. secure the wire rope end to a ground terminal on the cool wall of the processing chamber.

A thermocouple receiving hole is located in a back surface of the susceptor to provide temperature information. The thermocouple wiring is routed from a threaded hole in the back of the susceptor through an opening in the web in the hub end of the susceptor arm and through the enclosable channel and through a seal at the center of bellows which accommodates up and down movement of the susceptor assembly.

The enclosable channel is covered by a channel cover which closes the channel and blocks direct radiation from the heat lamps. The cover is paddle shaped to match the configuration of the susceptor arm and slides laterally into grooves in the side of the channel to cover and enclose the contents of the channel.

In one configuration, the hub end of the ceramic arm includes a keyhole shaped slot which receives a susceptor hub alignment blade. The blade aligns the susceptor to the arm. A circle end of the keyhole slot allows the grounding rope (now integrally connected to the susceptor hub) with a keyhole shaped end lug to pass through the slotted opening during assembly.

The metallic susceptor, bellows, and sealing sleeve at the bellows end of the susceptor arm are all secured to the ceramic susceptor arm by shoulder bolts mounted to split conical spring washers which secure the pieces together special without special torquing requirements and which are able to maintain pressure while accommodating relatively large dimensional changes.

To increase corrosion resistance to the corrosive environment of the processing chamber, the shoulder screws should be electropolished. The surfaces of aluminum pieces (except those across which electrical conductivity is required) should be anodized to minimize deleterious effects. Stainless steel and Inconel pieces should be finished with a nickel sulfumate plating.

The configuration as described according to the invention provides a susceptor assembly configuration which assures that the susceptor will be grounded at all times. It also and minimizes the dependence on a technician's assembly technique when assembling components and thereby eliminates the problems of the prior art.

DETAILED DESCRIPTION

As illustrated in FIG. 1, susceptor assemblies 31 are commonly used in processing chambers 20 to support a wafer 30 opposite a gas distribution plate 22. This susceptor assembly 31 moves up and down to receive and present the wafer 30 to and from lift fingers (not shown) which lift the wafer 30 from a robot blade (not shown) that transfers the wafer into and out of the processing chamber 20. The up and down movement of the susceptor assembly 31 is controlled by a bellows assembly 38 which has at its core a rigid, hollow tube (pipe) 198 connected at its bottom to a susceptor lift mechanism (not shown) which raises and lowers the susceptor assembly 31 within the process chamber according to process requirements.

Figure 5:
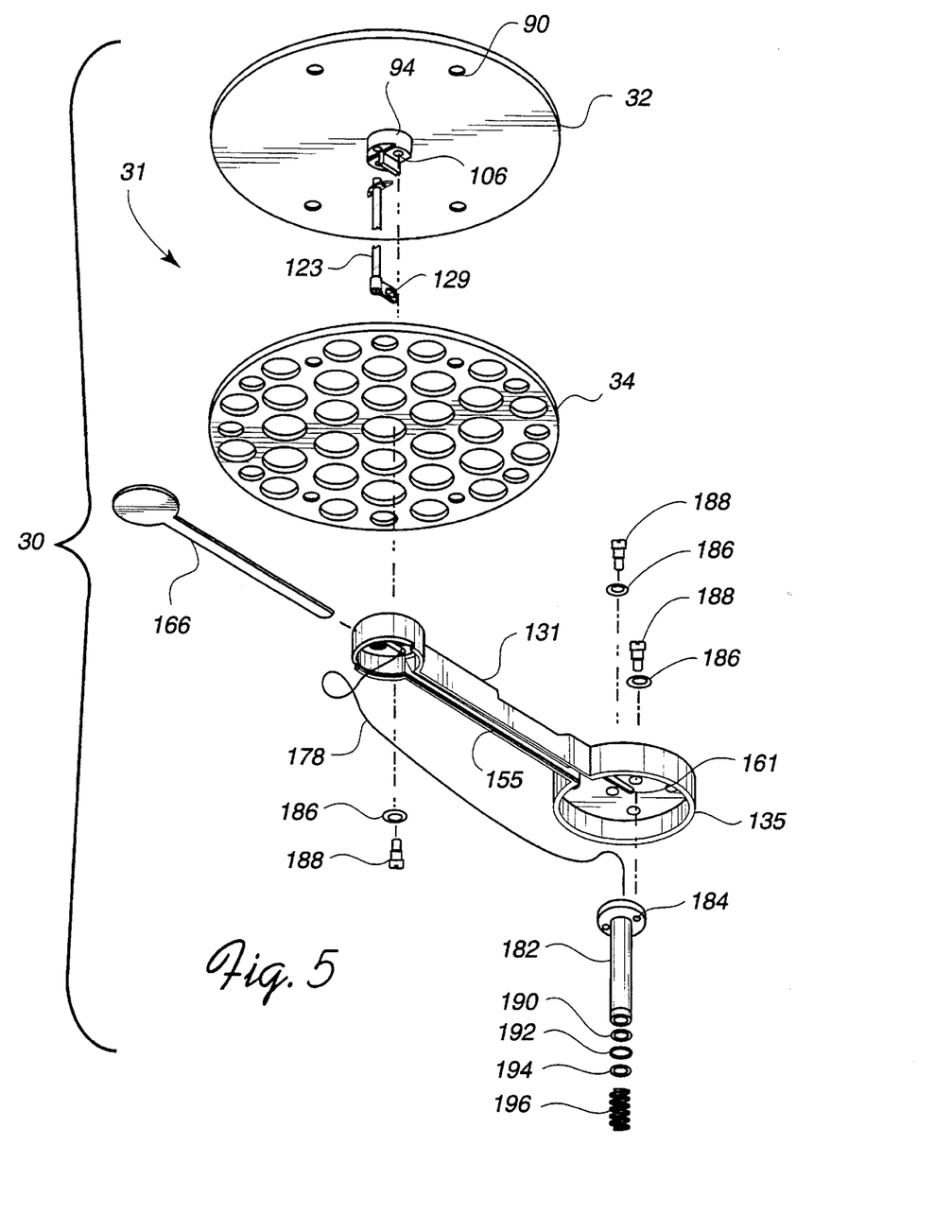
FIG. 5 shows an exploded view of the susceptor assembly according to the invention.

The susceptor disk 32, as illustrated in FIGS. 1 and 5, has a bottom covered with a perforated ceramic insulating disk 34 patterned like Swiss cheese. The susceptor disk 32 and the insulating disk 34 are cantilevered over the quartz window 26, by a susceptor arm (36, 131). Radiant heat lamps 24 enclosed by a reflector/shield 28 heat the bottom side of susceptor 32 and the insulating disk 34. The temperature of the susceptor is raised and maintained in close proximity to wafer processing temperatures, thereby preventing or minimizing differential stresses and strains associated with changing temperatures.

Figure 6:
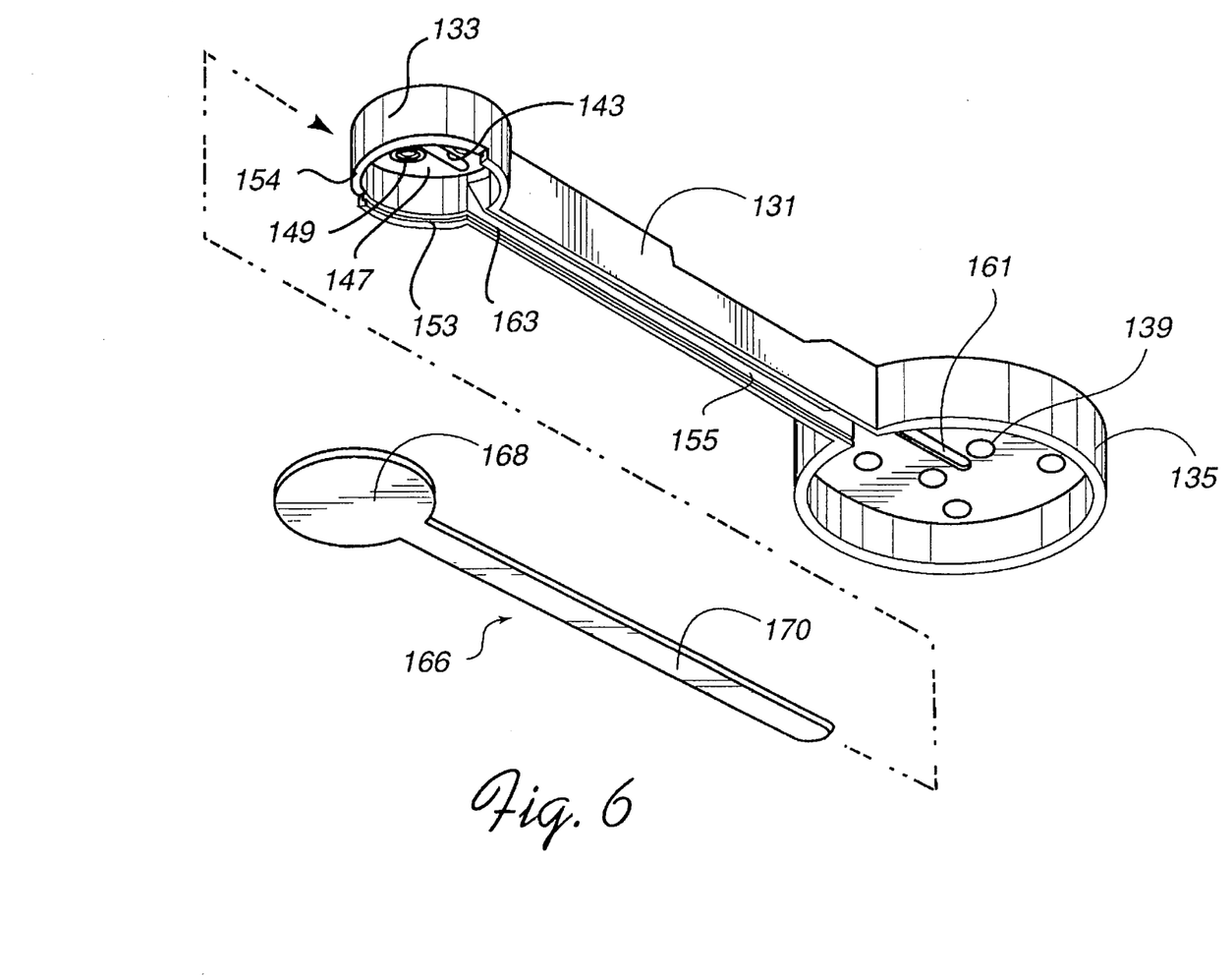
FIG. 6 shows a perspective view of the susceptor arm and its channel cover piece according to the invention.

The susceptor disk 32 and insulating disk 34 are supported by a one piece susceptor arm 131. The susceptor arm is made of ceramic material (preferably alumina) and includes a channel 155 along its length to carry a grounding conductor (a wire rope 123) and a thermocouple lead 178. A set of grooves 163 in the bottom sides of the channel 155 slidably receive a channel cover 166 to block radiation from the radiant heat lamps 24 from directly shining on the thermocouple and grounding wiring (FIG. 6).

Figures 7, 8, 9:
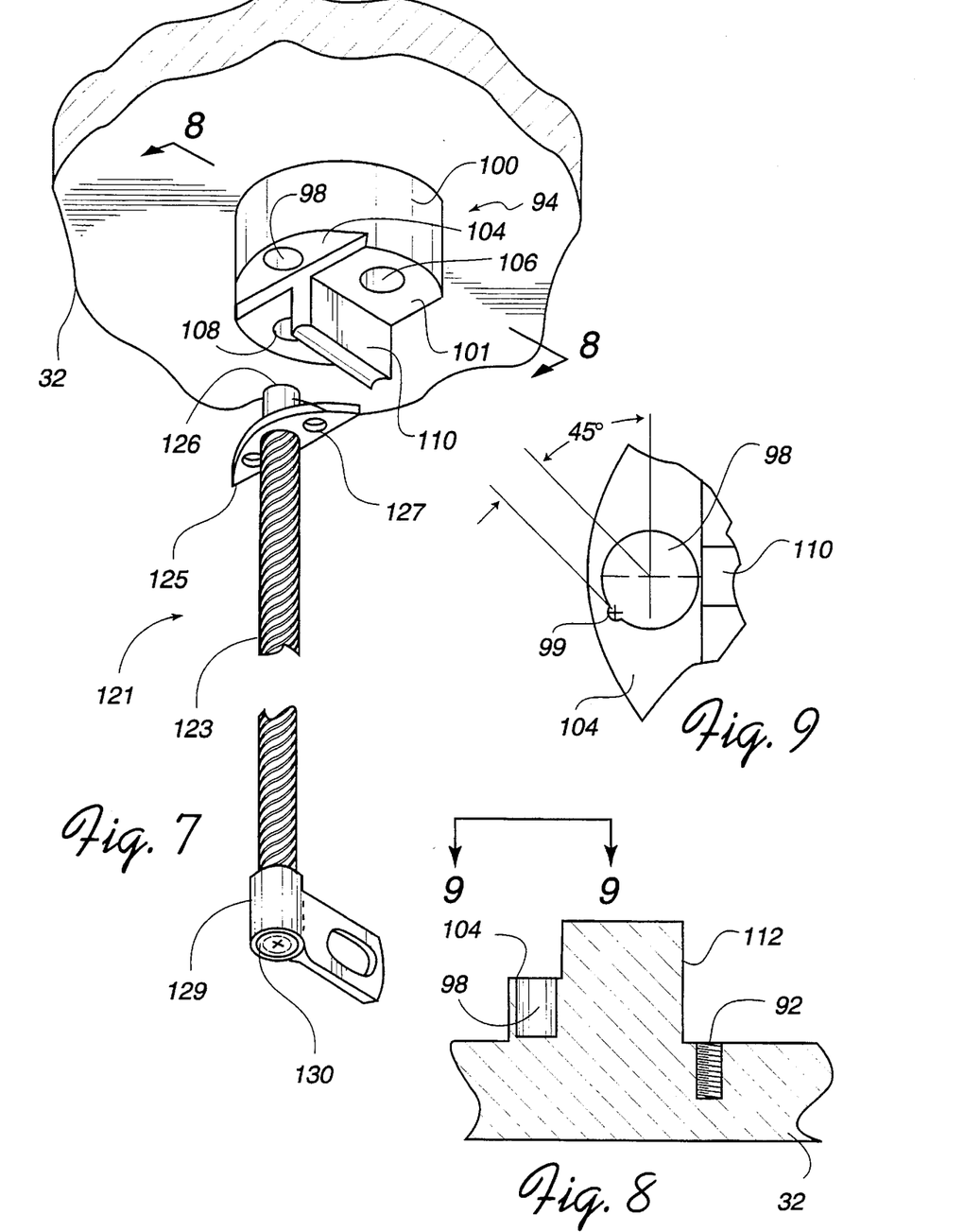
FIG. 7 shows an assembly view of the ground wire assembly in relation to a susceptor hub according to the invention.
FIG. 8 shows a cross-section through the center of the susceptor of hub of FIG. 7 taken at 8—8.
FIG. 9 shows a top view of the hub of FIG. 8 viewed from 9—9.

As can be seen in FIG. 5 and 7, the susceptor assembly 30 includes a susceptor disk 32 (the same part as prior art susceptor plates or disks 32) preferably of aluminum is integral with a susceptor hub 94 with susceptor attachment holes 106, 108 and susceptor lift pin holes 90. The susceptor attachment holes 106, 108 have threads which are lined with helicoils which have been nickel sulfumate plated with 0.0003–0.0005" thick plating for superior corrosion resistance.

The ground rope assembly 121 as shown in FIG. 7 includes a wire rope or cable 123 preferably made of aluminum. It is attached to a double winged terminal 125 at the susceptor end of the wire rope and to a key shaped lug terminal 129 at the process chamber end of the ground rope 123. To assure a tight electrical bond between the ground rope 123 and the double winged terminal 125 and keyhole shaped lug 129, each double winged terminal 125 and lug 129 are welded to the wire rope at the distal ends of the connection between the wire rope and the terminal and lug. The weld connecting the wire rope 123 to the double winged terminal 125 is at the outside end of the terminal and is designated 126. Similarly the weld at the outside end of the lug terminal 129 is identified by the number 130. Both welds connect the circumference of the cylindrical part of the terminal or lug to the circumference of the aluminum rope. This welding method minimizes the amount of distortion and differential thermal stress generated between pieces. When welding is done using electron beam techniques the amount of heat input and warpage is negligible. The double winged terminal 125 and lug 129 are first welded to the wire rope 123 and then the double winged terminal 125 is welded to the susceptor as will be described below, all prior to other assembly. The steps of a method for securing a ground connection for a susceptor are clear by following the assembly of the described pieces.

A close-up view of the susceptor hub 94 is shown in FIG. 7. A susceptor hub 94 includes a cylindrical susceptor hub body 100 descending from the bottom surface of the susceptor 32. The hub body 100 has flat 112 on one side to allow space for passage of the thermocouple lead through the web 147 of the hub end 133. The susceptor hub body 100 includes and end support surface 101 having attachment holes 106 and 108 therein equipped with helicoil inserts, as previously discussed. The susceptor hub body 100 also includes a ledge 104 which contains a hole 98 for receiving the welded end 126 of the double winged terminal 125 so that the cylinder of the terminal fits tightly within the receiving hole 98. Cross sectional and top views of the configuration of the terminal receiving hole 98 can be seen in FIGS. 8 and 9. In the case where the fit between the cylinder of the double winged terminal 125 and the ground wire receiving hole 98 is extremely tight, a release channel 99, (a half cylindrical groove in the side of the hole 98 located at 45° to the blade 110 axis) allows air to escape while the terminal with wings 125 is pushed into position. The double winged terminal 125 and hole 98 are configured so that the end of the terminal does not touch the bottom of the hole 98, and so that the movement of the terminal 125 into the hole 98 is stopped by the wings which extend out from the side of the terminal 125. The wings then rest on the wing ledge 104 of the hub body 100. Once the terminal 125 is in position, electron beam welding is performed at holes 127 in each wing. The welding is done within the holes to connect the terminal wings to the susceptor. When using electron beam welding the amount of heat input is very small and the body of the hub 100 easily dissipates the heat without warpage or distortion of the mating pieces. The terminal 125, the lug 129, susceptor, and wire rope are all made of aluminum preferable types 1100, 1100, 1100, and 1350 respectively.

A susceptor hub alignment blade 110 extends from the hub body 100 to align the susceptor arm 131.

During assembly the key (keyhole) shaped lug 129 and the attached wire rope pass through the perforated backing plate 34 and through a lug matching keyhole shaped slot of a web 147 located in the hub end 133 of the susceptor arm 131 so that the web 147 supports the susceptor hub at its support face 101. The keyhole shaped slot 143 (FIGS. 10, 11, 12,) allows the lug 129 to freely pass through to be routed down the channel 155 of the arm 131 to be grounded at the process chamber wall.

Figure 16:
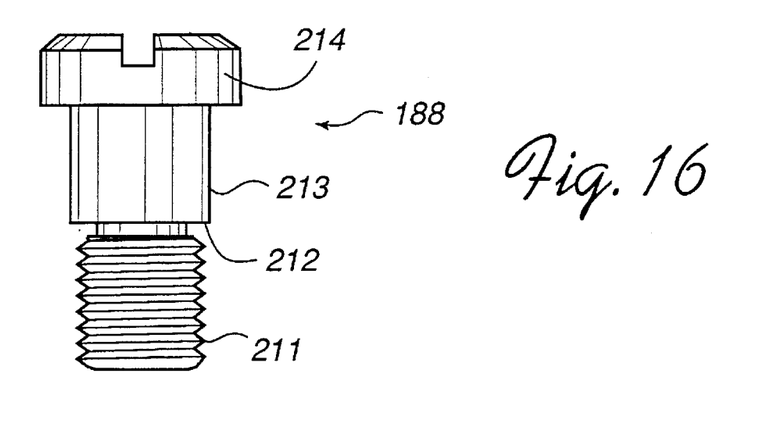
FIG. 16 shows a shoulder screw.
Figure 17:
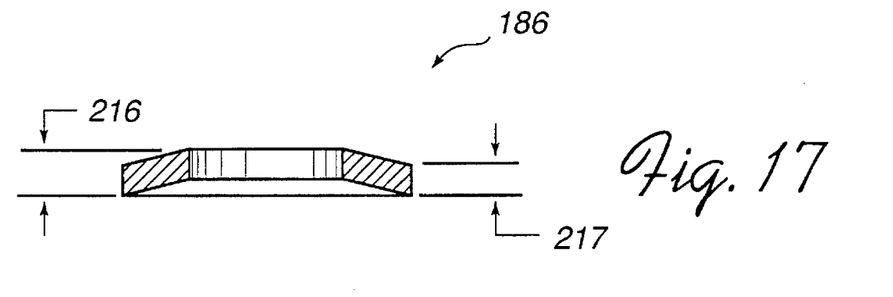
FIG. 17 shows a cross-section of a slotted conical spring washer of FIG. 18 taken at 17—17.
Figure 18:
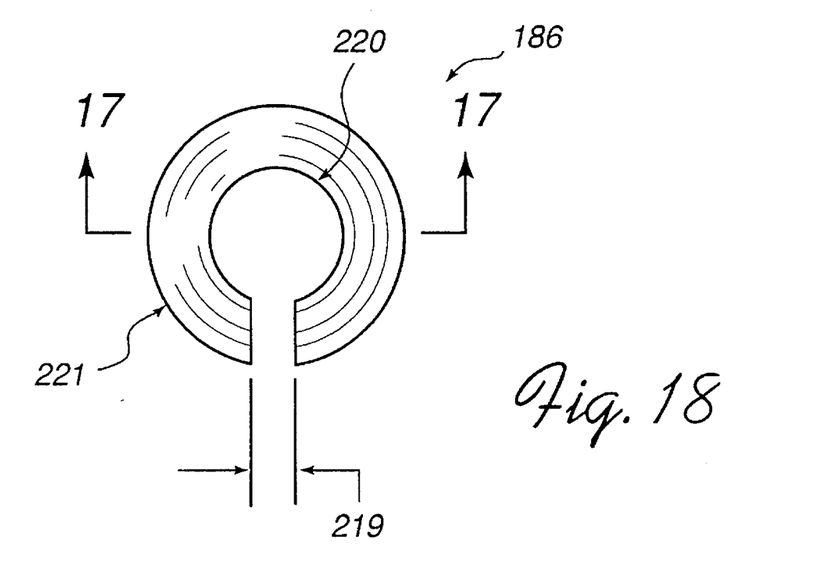
FIG. 18 shows a top view of a conical spring washer.

The susceptor 32 is held to the susceptor arm 131 by the two shoulder screws 188 with associated split conical spring washers 186. The shoulder bolt 188 and the conical spring washers 186 can be seen in FIGS. 16, 17, and 18. Slotted conical spring washers are described in U.S. Pat. application Ser. No. 08/094,674, filed Jul. 20, 1993, by Fodor et al. The inner diameter (I.D.) 220 of the conical spring washer closely matches the diameter of the shank 213 of the shoulder bolt 188 such that the head 214 of the shoulder bolt 188 will not pass through the inner diameter 220. The outer diameter (O.D.) 221 closely matches and/or is slightly smaller than the diameter of the counterbores 149 and 151 in the web 147. The shoulder bolts are completely threaded into susceptor attachment holes 108, 106 until the bolt is tight against the shoulder 212 between the shank 213 and the threads 211. The bottom of the screw head 214 is then resting on top of the thickness 216 of the conical spring flange and compresses the washer 186 until it is nearly flat (slightly more than the material thickness 217). As the washer 186 is being compressed, the washer gap 219 attempts to open to relieve the pressure. However, because the washer is located in a counterbore it cannot spread out, but is held tightly to elastically bend the washer ring. The use of a slot in a spring washer in this configuration increases the effective elastic range and life available when compared to using a conventional spring washer. For corrosion resistance and high strength the shoulder bolt 188 and conical spring washer 186 are constructed of Inconel X-750. The shoulder screw is electropolished with 0.0002–0.0003 (0.005 mm) of material removed while the conical spring washer is sulfumate nickel electroplated with a 0.0003–0.0005" (0.010 mm) thick plating.

Figure 13:
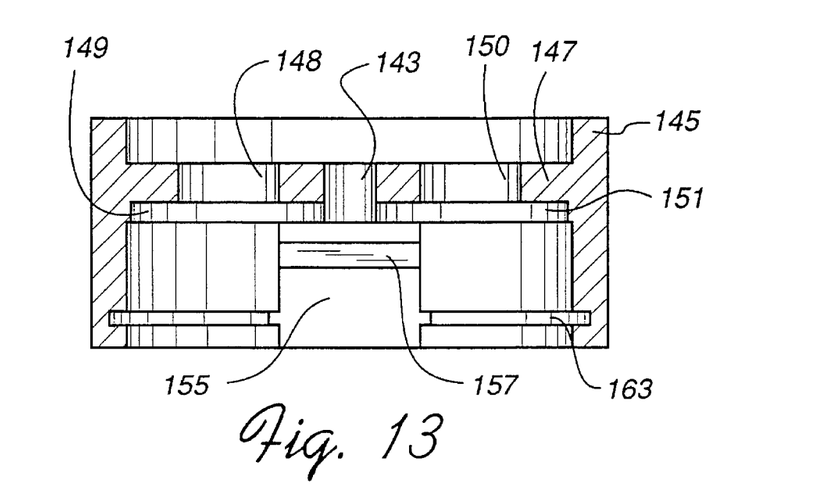
FIG. 13 shows a cross-sectional view of FIG. 11 taken at 13—13.

FIG. 13 provides a cross sectional end view taken at the center of the hub end 133 of the susceptor arm 131 facing the bellows end 135 of the susceptor arm. Counterbores 149 and 151 at the bottom of the screw holes 148 and 150 are sized to receive appropriately sized split conical spring washers 186 through which the shoulder screws 188 are screwed into the helicoils in the hub holes 108, 106 to thereby secure the susceptor disk 32 and hub 94 to the hub end 133 of the susceptor arm 131. The edge of the counterbores 149 and 151 at their edges open on the keyhole slot 143. A flange 145 extends up from the web 147 to act as a cowling surrounding the hub 94 of the susceptor.

Figure 15:
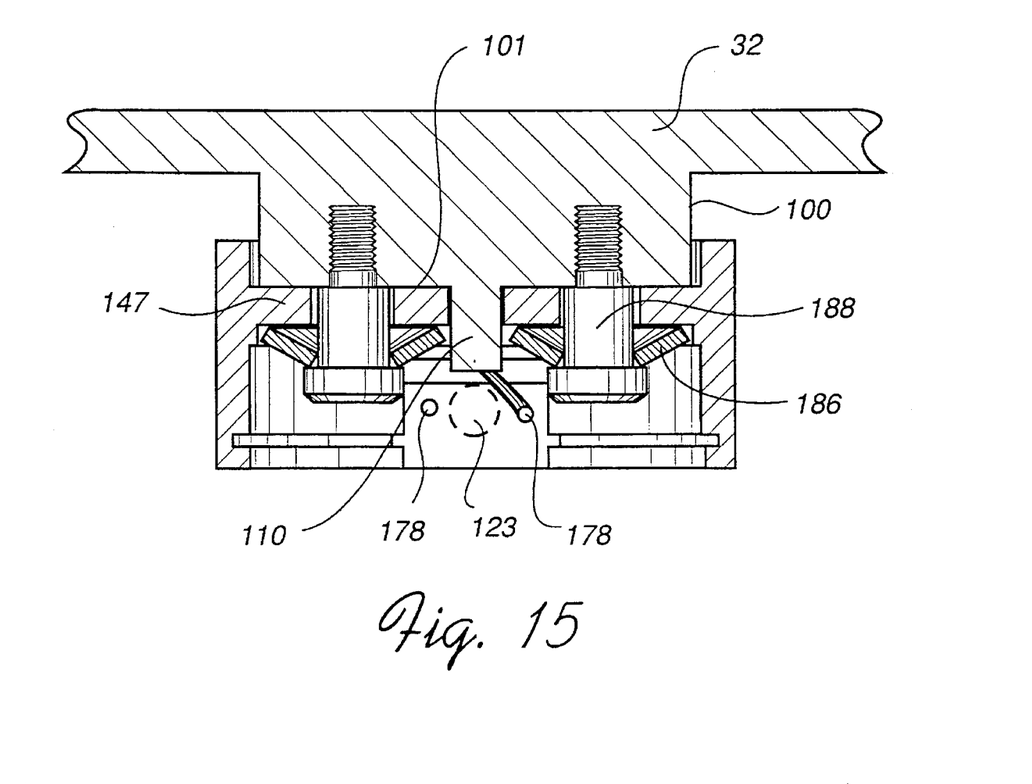
FIG. 15 shows the cross-sectional of FIG. 14 taken at 15—15.

When the susceptor disk 32 and hub 94 is attached to the hub end 133 of the susceptor arm 131 the cross-section seen in FIG. 13 changes to that seen in FIG. 15. The hub body 100 support face 101 contacts the top of the web 147 of the hub end and the susceptor hub alignment blade 110 fits into the keyhole shaped slot 143. The shoulder bolts 188 pass through the slotted conical washers 186 and tightly hold the susceptor 25 to the susceptor arm 131.

Figure 14:
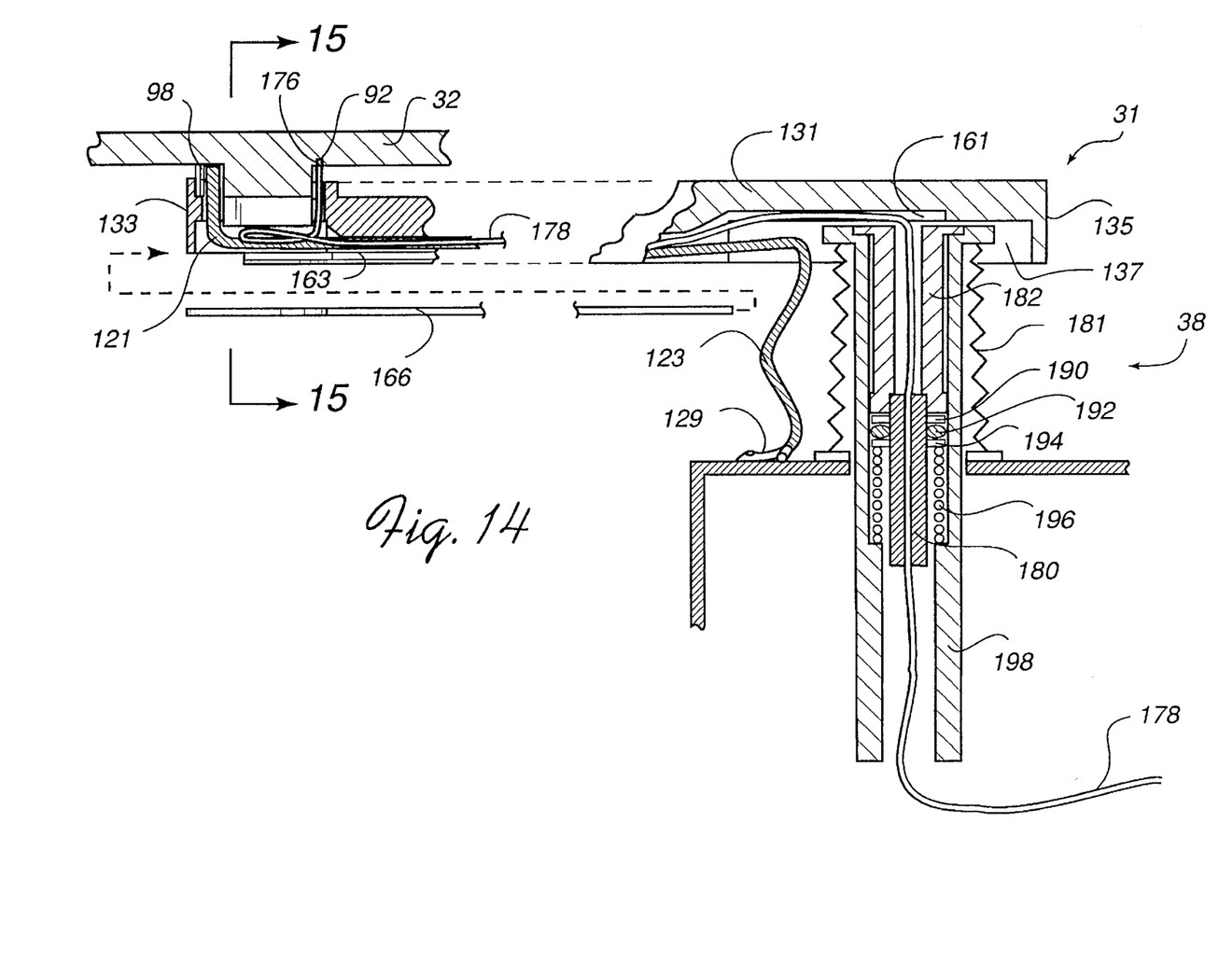
FIG. 14 shows a partial cross-section of a close-up view of a susceptor assembly according to the invention.

The thermocouple lead 178 connects to a thermocouple junction 176 which is located in a susceptor thermocouple hole 92 (FIGS. 8 and 14) in the back side of the susceptor disk 32. This susceptor thermocouple hole 92 is preferably threaded to receive a threaded end of the thermocouple lead 178. FIG. 14, shows an example of the routing of the ground wire assembly 121 and the thermocouple lead 178, which passes through the narrow end of the slot 143 at the other end of the susceptor hub line blade 110. The thermocouple lead 178 is looped within the hub end 133 to avoid bending the lead sharply and thereby enhancing its reliability at elevated temperatures as it is routed through the channel 155.

The susceptor arm 131 is configured to route the grounding rope 123 and the thermocouple lead 178 through the channel passage 155. Bevels 157, 159 in the ends of the channel passage 155, as shown in FIG. 11 minimize sharp corners which may damage the cables and provide a smooth transition for the wiring to enter and leave the channel 155.

Figure 10:
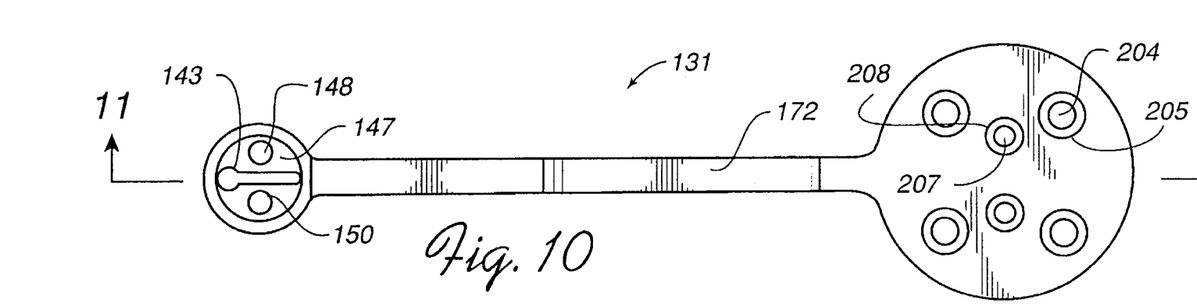
FIG. 10 shows a top view of a susceptor arm according to the invention.
Figures 11, 12:
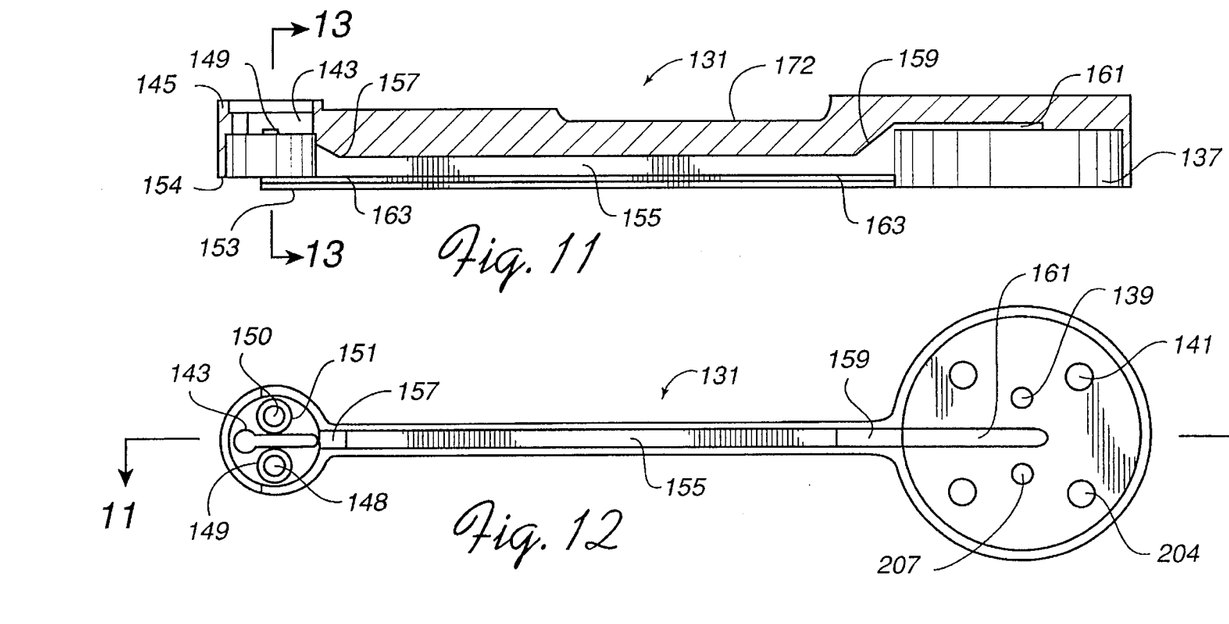
FIG. 11 shows a cross-sectional view of FIGS. 10 and 12 taken at 11—11.
FIG. 12 shows a bottom view of a susceptor arm according to the invention.

In FIGS. 1, 10, and 11, a throat depression 172 of the arm 131 can be seen. This depression 172 provides a larger clearance between the edge of the susceptor disk 32 and the arm to reduce any conductive effects and sparking which might be induced.

As shown in FIGS. 6, 11, and 14, the cover receiving grooves 163 inside of the susceptor support arm channel 155 extend parallel to the throat of the support arm 131 and around the perimeter of the hub end 133 of the arm to the end of the greater than half-circle flange 153 on the bottom side of the hub end 133. This flange 153 can be seen in FIG. 11, to extend slightly past the center line of circular hub toward its distal end (FIG. 6) so that when the throat 170 of the channel cover 166 is introduced into the slot 163, it slides towards the bellow end 135 of the arm 131 until the edge of the circular end 168 of the cover 166 mates with the slot 163 in the flange 153. When the cover 166 is secured in the slot 163, the flange 153 holds the channel cover circular end 168 against an end flange 154 of the bottom of the hub end 133 of the susceptor arm 131. The channel cover 166 is sized to fully cover the channel 155 in the support arm but, as shown in FIG. 14, leaves open the cavity 137 of the bellows end 135 of the support arm. The wire rope grounding cable 123 passes through the open space at the bottom of the channel and a screw secures its lug 129 to the chamber at a location remote from the heated susceptor.

As illustrated in FIG. 14, outside the beam of the heating lamps, a ground rope assembly 121 connected to the back of the susceptor disk 32 and hub 94 is connected to the wall of the processing chamber 20 by a lug terminal 129 by a tightly secured screw. Since the wall of the processing chamber is relatively cool compared to process conditions the effects of thermal cycling are not as severe and therefore do not cause loosening of the connection. The thermocouple lead 178 is routed to the center of a bellows 181 via a wire guide groove 161 in the bottom of a cavity 137 at a bellows end 135 of the susceptor arm 131.

The thermocouple lead 178 is potted into and through a thermocouple potting plug 180 which is surrounded by a vacuum seal. The vacuum seal includes a flanged sleeve 182 mounted inside the pipe 198 inside the bellows 181. As can be seen in the exploded view of FIG. 5 and the cross-section of FIG. 14, the flanged sleeve 182 has an enlarged ring around the bottom end of the tube to present a flat surface to a flat washer 190, O-ring 192, flat washer 194 sandwich. When the potting adapter 180 is in place and a vacuum is applied in the processing chamber, the O-ring 192 is urged by outside ambient pressure to seal between the thermocouple potting adapter 180 and the inside of the rigid pipe 198. A spring 196 assists in the sealing. A ledge around inside of the pipe 198 supports the bottom end of the spring 196.

As shown in FIG. 5, the flange of the flanged seal 182 includes two tapped holes 184 for attachment to the channel end 135 of the susceptor arm 131. As can be seen in the cross-section of FIG. 14, the upper flange of the pipe 198 includes a recess to accommodate and envelop the flange of the sleeve 182 without interference. The flanged sleeve 182 is preferably constructed of 304 L stainless steel and is finished with a nickel sulfumate plating 0.0003–0.0005 (0.01 mm) thick. This plating prevents corrosion and extends the life of the assembly. The bellows are also nickel sulfumate plated to provide similar corrosion resistance and extend the life of the unit in the corrosive processing environment.

As can be seen in the FIGS. 5, 6, 10, and 12, two shoulder bolts 188 having slotted conical spring washers 186 slide in through holes 207 in a sleeve connection hole pattern 139 in the center of the bellows end 135 of the susceptor arm 131 and are threaded into the tapped holes 184 in the flange of the sleeve 182 to attach it to the susceptor arm 131. The through holes 207 have a counterbore 208 on their top side. Similarly, four through holes 204 in a bellows connecting hole pattern 141 include counterbores 205 around the holes as seen from the top side of the susceptor arm in FIG. 10.

Slotted conical spring washers 186 are placed in the counterbores 205, 208 (each conical spring washer 186 with its related should bolt 188 being sized according to its function).

The pieces are assembled as follows. The wire rope assembly, already welded to the susceptor is routed through the hub end 133 of the susceptor arm keyhole shaped slot 143. The thermocouple junction 176 is threaded into the thermocouple hole 92. The thermocouple lead 178 passes through the other end of the keyhole shaped slot 143. The susceptor hub 94 is then fastened to the ceramic arm 131 using split conical spring washers 186 held in position by shoulder screws 188. The ground rope 123 and thermocouple wire are routed through the arm channel 155. The thermocouple is routed and sealed at the center of the bellows lift mechanism 38 which is attached to the arm 131 by split conical spring washers 186 and shoulder screws. The end lug 129 of the ground rope 123 is securely attached to a ground terminal. The channel cover 166 is then slid into place.

While the invention has been described in regards to specific embodiments, those skilled in the art will recognize that changes can be made in form and detail without departing from the spirit and scope of the invention.

We claim:

1. A susceptor assembly comprising:

a susceptor for holding a substrate to be processed;

a susceptor arm supporting said susceptor;

a susceptor arm support device supporting said susceptor arm, said susceptor arm comprising a ceramic material containing an open channel for carrying wiring between the susceptor and the support device; and a conductive wire welded to said susceptor and routed through said channel in said susceptor arm to an electrical connection.

2. A susceptor assembly as in claim 1, further comprising a thermocouple connected to said susceptor and a thermocouple lead connected to said thermocouple and routed adjacent to said electric wire to said support device in said channel.

3. The susceptor support as in claim 2, wherein said susceptor arm includes a wire guide groove to route said thermocouple lead to a center passage of said susceptor arm support device.

4. A susceptor assembly as in claim 1, wherein said susceptor includes a hub extending from a back side of said susceptor;

wherein said conductive wire has a terminal lug attached to its end, and including a wing extending laterally from an axis of said conductive wire such that when said lug is inserted into a terminal lug receiving hole of said susceptor hub said wing rests on a surface of said hub, and wherein said wing is welded to said hub.

5. A susceptor assembly as in claim 4, wherein said wing includes a weld location hole at which point said welding is performed.

6. A susceptor assembly as in claim 1, wherein said susceptor includes a hub extending from a back side of said susceptor;

wherein said conductive wire has a terminal lug attached to its end, and including a wing extending laterally from an axis of said conductive wire, wherein said wing is welded to said hub.

7. A susceptor assembly as in claim 6, wherein said wing includes a weld location hole at which point said welding is performed.

8. The susceptor assembly as in claim 1, wherein said susceptor arm supporting said susceptor extends transversely to said susceptor.

9. The susceptor assembly as in claim 8, further comprising:

a removable channel cover attached to said support arm to enclose a portion of said conductor in said channel.

10. The susceptor assembly as in claim 9, wherein said channel cover is attached to said support arm within said channel by having opposed edges which slide into two slots facing one another on the inside of said channel.

11. The susceptor assembly as in claim 1, further comprising:

a removable channel cover attached to said support arm to enclose a portion of said conductor in said channel.

12. The susceptor assembly as in claim 11, wherein said channel cover is attached to said support arm within said channel by having opposed edges which slide into two slots facing one another on the inside of said channel.

13. A susceptor assembly for processing a substrate at temperatures of up to 500 degree Celsius comprising:

a susceptor having a substantially planar surface for supporting a substrate;

a ceramic susceptor arm supporting said susceptor from a susceptor support arm support device, wherein said susceptor arm includes an open channel for routing wiring from a hub end of said support arm adjacent to said susceptor to a support end of said support arm distal from said susceptor, wherein said channel includes a removable channel cover attached to said support arm to enclose a portion of said conductor in said channel.

14. A susceptor assembly as in claim 13, wherein said channel cover is paddle shaped and generally covers an opening at the bottom of a hub end of said susceptor arm.

15. The susceptor assembly for processing a substrate as in claim 13 wherein the susceptor arm support device is positioned transverse from a center of said susceptor.

16. The susceptor assembly for processing a substrate as in claim 15 wherein said channel includes oppositely spaced grooves for receiving a channel cover which slides transversely into said channel grooves.

17. The susceptor assembly for processing a substrate as in claim 13 wherein said channel includes oppositely spaced grooves for receiving a channel cover which slides transversely into said channel grooves.

18. A susceptor assembly comprising:

a susceptor with threaded screw holes, wherein said susceptor is fixed to a susceptor support arm by the use of a spring fastening system comprising split conical spring washers and shoulder bolts disposed in holes with counterbores of a susceptor arm web, such that when the thread shoulder of said shoulder bolts are tightened against said susceptor the split conical spring washers are axially confined between the head flange of the shoulder bolt and the bottom of the counterbore the axial compression of the split conical spring washer causes its free ends to radially spread into contact with the inside diameter of said counterbore, preventing the washer from further radial expansion, wherein tightening of the bolt to its thread shoulder establishes a set spring load between the susceptor and said web of said susceptor support arm which urges the susceptor hub in contact with the susceptor arm.

19. A susceptor assembly as in claim 18, wherein those threaded screw holes are lined with nickel sulfamate plated helicoils.

20. A susceptor assembly as in claim 18, wherein said screws are electropolished and said washers are nickel sulfamate plated.

21. A method of connecting a susceptor to support a semiconductor substrate in a processing chamber to a ground terminal comprising the steps of:

welding a terminal lug having a side flange to a first end of a flexible ground conductor, placing said side flange in contact with a surface of the susceptor, welding said side flange to said surface of the susceptor, attaching the susceptor to a susceptor support through a releasable connection in a substrate processing chamber, said susceptor support holding said susceptor in position to support a substrate for processing in the processing chamber, routing said flexible ground conductor supported at a susceptor end from said susceptor to a ground terminal of said chamber supporting a ground terminal end of said flexible ground conductor, wherein installation of the susceptor/ground conductor combination involves positioning said susceptor/ground conductor combination in contact with the susceptor support and releasably connecting the susceptor to the support and routing the ground terminal end of the ground conductor to said ground terminal of said chamber and removably connecting the ground terminal end of the conductor to the ground terminal, without releasing the susceptor support from its support member, wherein removal of the susceptor/ground conductor combination involves releasing the releasable connection connecting the susceptor to the support and releasing the releasable connection connecting the ground terminal end of the conductor to the ground terminal and separating the susceptor from its contact with the susceptor support member.

22. In a semiconductor processing chamber, a method of connecting a susceptor to a ground terminal comprising the step of:

welding a terminal lug having a side flange to a first end of a ground conductor, placing said side flange in contact with a surface of the susceptor, welding said side flange to said surface of the susceptor, routing said ground conductor to the ground terminal through an open channel in a susceptor support arm.

23. In a semiconductor processing chamber, a method of connecting a susceptor to a ground terminal as in claim 22, further comprising steps of:

welding a lug to a second end of said ground conductor; and passing said lug through a set of openings in said susceptor support arm through said open channel, and to the ground terminal.

24. A susceptor assembly in a semiconductor processing chamber comprising:

a flexible electrical conductor having a susceptor end and a remote connection end, wherein said remote connection end includes a lug terminal, said lug terminal being used to secure said remote connection end to a remote connection terminal;

an electrically conductive susceptor for supporting a substrate to be processed in said processing chamber, wherein said susceptor is electrically connected to said susceptor end of said flexible electrical conductor through welded connections which assure electrical continuity between a set of conductive elements which form the electrical path between the conductor and the susceptor;

a susceptor support arm supported at a support end of said arm by a susceptor arm support, said support arm supporting said susceptor at a susceptor end of said support arm, wherein said susceptor support arm is configured to have a receiving hole configured to pass said lug terminal there through, wherein said susceptor support arm is configured to include an open channel generally passing from said susceptor end of said support arm to the support end of said support arm to receive said conductor within said channel as the conductor is routed to said remote terminal connection:

wherein removal of said susceptor can be done by removing the terminal lug from its remote connection terminal, removing the conductor from the channel, separating the susceptor from the susceptor end of the support arm as the conductor and lug terminal pass through the receiving hole;

wherein replacement of said susceptor can be done by passing the conductor and lug terminal through the receiving hole as the susceptor is joined to the susceptor end of the support arm, positioning said conductor in said channel as it is routed toward the support end of said arm, and attaching said terminal lug to said remote connection terminal;

wherein said susceptor support arm may remain fixed to said susceptor arm support throughout such susceptor removal and replacement.

25. The susceptor assembly in a semiconductor processing chamber as in claim 24, wherein said support arm is made of a ceramic material.

26. The susceptor assembly in a semiconductor processing chamber as in claim 25, further comprising:

a removable channel cover attached to said support arm to enclose a portion of said conductor in said channel.

27. The susceptor assembly in a semiconductor processing chamber as in claim 26, wherein said channel cover is attached to said support arm within said channel by having opposed edges which slide into two slots facing one another on the inside of said channel.

28. The susceptor assembly in a semiconductor processing chamber as in claim 26, wherein said susceptor end of said support arm includes a hub having a web supporting said susceptor, wherein said web includes said receiving hole through which said lug terminal and said conductor pass, wherein a portion said hub on the side of the web opposite said susceptor forms part of said channel in said susceptor arm, wherein said cover of said channel also covers said hub so that the cover acts as a barrier to prevent radiant heat from heating lamps from directly radiating on the conductor contained in said channel and covered by a said channel cover.

29. The susceptor assembly in a semiconductor processing chamber as in claim 28, wherein said channel cover is attached to said ceramic support arm within said channel by having opposed edges which slide into two slots facing one another on the inside of said channel.

30. A susceptor assembly in a semiconductor processing chamber comprising:

a flexible electrical conductor having a susceptor end and a remote connection end, wherein said remote connection end includes a lug terminal, said lug terminal being used to secure said remote connection end to a remote connection terminal;

a set of flexible electrical conductors connecting a temperature sensor at one end to a temperature monitoring apparatus at another end;

an electrically conductive susceptor for supporting a substrate to be processed in said processing chamber, wherein said susceptor is electrically connected to said susceptor end of said flexible electrical conductor through welded connections which assure electrical continuity between a set of conductive elements which form the electrical path between the conductor and the susceptor, wherein said temperature sensor is connected to said susceptor to sense its temperature;

a susceptor support arm supported at a support end of said arm by a susceptor arm support, said support arm supporting said susceptor at a susceptor end of said support arm, wherein said susceptor support arm is configured to have a receiving hole configured to pass said lug terminal there through, wherein said susceptor support arm is configured to include an open channel generally passing from said susceptor end of said support arm to the support end of said support arm to receive said conductor and said set of flexible conductors within said channel as the conductor is routed to said remote terminal connection and said set of flexible electrical conductors are routed to said temperature monitoring apparatus, wherein said receiving hole is also configured to pass the temperature sensor and electrical conductors;

wherein removal of said susceptor can be done by removing the terminal lug from its remote connection terminal, removing the conductor from the channel, separating the susceptor from the susceptor end of the support arm as the conductor and lug terminal pass through the receiving hole and removing the temperature sensor from said susceptor;

wherein replacement of said susceptor can be done by attaching said temperature sensor to said susceptor, passing the conductor and lug terminal through the receiving hole as the susceptor is joined to the susceptor end of the support arm, positioning said conductor in said channel as it is routed toward the support end of said arm, and attaching said terminal lug to said remote connection terminal;

wherein said susceptor support arm may remain fixed to said susceptor arm support throughout such susceptor removal and replacement.

31. The susceptor assembly in a semiconductor processing chamber as in claim 30, wherein said support arm is made of a ceramic material.

32. The susceptor assembly in a semiconductor processing chamber as in claim 31, further comprising:

a removable channel cover attached to said ceramic support arm to enclose a portion of said conductor and said set of conductors in said channel.

33. The susceptor assembly in a semiconductor processing chamber as in claim 32, wherein said channel cover is attached to said ceramic support arm within said channel by having opposed edges which slide into two slots facing one another on the inside of said channel.

34. The susceptor assembly in a semiconductor processing chamber as in claim 32, wherein said susceptor end of said ceramic support arm includes a hub having a web supporting said susceptor, wherein said web includes said receiving hole through which said lug terminal, said conductor, and said set of conductors pass, wherein a portion said hub on the side of the web opposite said susceptor forms part of said channel in said susceptor arm, wherein a cover of said channel also covers said hub so that the cover acts as a barrier to prevent radiant heat from heating lamps from directly radiating on the conductor and set of conductors contained in said channel and covered by a said channel cover.

35. The susceptor assembly in a semiconductor processing chamber as in claim 34, wherein said channel cover is attached to said ceramic support arm within said channel by having opposed edges which slide into two slots facing one another on the inside of said channel.

36. A method of connecting a susceptor to support a semiconductor substrate in a processing chamber to a ground terminal comprising the steps of:

attaching the susceptor to which a flexible ground conductor has been welded, a susceptor/ground conductor combination, to a susceptor support through a releasable connection in a substrate processing chamber, said susceptor support holding said susceptor in position to support a substrate for processing in the processing chamber, routing said flexible ground conductor supported at a susceptor end from said susceptor to a ground terminal of said chamber supporting a ground terminal end of said flexible ground conductor, wherein installation of the susceptor/ground conductor combination involves positioning said susceptor/ground conductor combination in contact with the susceptor support and releasably connecting the susceptor to the support and routing the ground terminal end of the ground conductor to said ground terminal of said chamber and removably connecting the ground terminal end of the conductor to the ground terminal, without releasing the susceptor support from its support member, wherein removal of the susceptor/ground conductor combination involves releasing the releasable connection connecting the susceptor to the support and releasing the releasable connection connecting the ground terminal end of the conductor to the ground terminal and separating the susceptor from its contact with the susceptor support, without releasing the susceptor support from its support member.

37. In a semiconductor processing chamber, a method of connecting a susceptor to a ground terminal as in claim 36, further comprising the step of:

routing said ground conductor to the ground terminal through a channel in said susceptor support.

38. In a semiconductor processing chamber, a method of connecting a susceptor to a ground terminal as in claim 37, wherein said channel is an open channel.

39. In a semiconductor processing chamber, a method of connecting a susceptor to a ground terminal as in claim 37, further comprising steps of:

welding a lug to a second end of said ground conductor; and passing said lug through a set of openings in said susceptor support arm through said channel, and to the ground terminal.

40. In a semiconductor processing chamber, a method of connecting a susceptor to a ground terminal as in claim 39, wherein said channel is an open channel.

* * * * *